United States Patent [19]

Watanabe

[11] Patent Number: 5,247,484
[45] Date of Patent: Sep. 21, 1993

[54] MULTIPORT DRAM

[75] Inventor: Nobuo Watanabe, Yokohama, Japan

[73] Assignee: Kabushiki Kaisha Toshiba, Kawasaki, Japan

[21] Appl. No.: 865,229

[22] Filed: Apr. 8, 1992

[30] Foreign Application Priority Data

Apr. 10, 1991 [JP] Japan ................. 3-077937

[51] Int. Cl.[5] .................................. G11C 7/00
[52] U.S. Cl. .................. 365/230.05; 365/230.03; 365/230.09; 365/239
[58] Field of Search .............. 365/230.05, 230.03, 365/230.09, 239, 240, 149

[56] References Cited

U.S. PATENT DOCUMENTS

| | | | |
|---|---|---|---|
| 4,891,794 | 1/1990 | Hush et al. | 365/239 X |
| 4,930,108 | 5/1990 | Sugiyama | 365/230.09 |
| 5,051,954 | 9/1991 | Toda et al. | 365/230.03 |
| 5,065,369 | 11/1991 | Toda | 365/230.05 |
| 5,121,360 | 6/1992 | West et al. | 365/230.05 |

Primary Examiner—Eugene R. LaRoche
Assistant Examiner—Son Dinh
Attorney, Agent, or Firm—Foley & Lardner

[57] ABSTRACT

A plurality of RAM blocks constituting a first RAM section and a second RAM section, respectively are arranged alternately in such a way that the inversion bit lines and the non-inversion bit lines of these RAM blocks are changed alternately block by block and further the two adjacent bit lines of the two adjacent RAM blocks are connected in common as a data line of the SAM blocks. By controlling data transfer control gates for switching on-off conditions of four bit lines of the two adjacent RAM blocks, it is possible to realize a cross transfer such that data can be transferred not only from the RAM blocks of the first RAM section and the second RAM section to the first SAM section and the second SAM section disposed as to correspond to the RAM sections, respectively, but also from the RAM blocks of the first RAM section to the SAM blocks of the adjacent second SAM section and additionally from the RAM blocks of the second RAM section to the RAM blocks of the adjacent first SAM section. Therefore, it is possible to continuously read and write data from and to the same RAM block, in addition to the alternate data read and write operation between the RAM blocks.

5 Claims, 5 Drawing Sheets

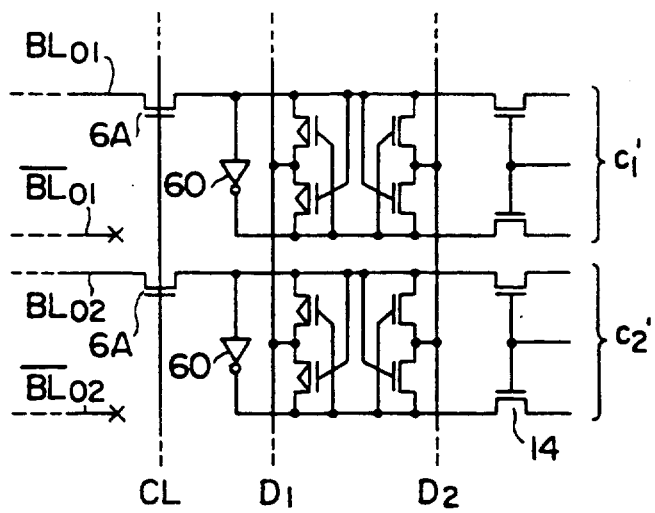
F I G. 6
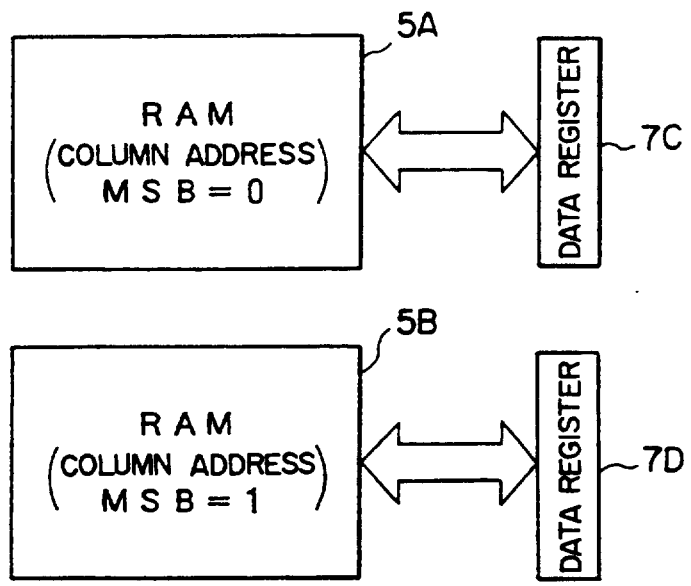
F I G. 7

MULTIPORT DRAM

BACKGROUND OF THE INVENTION

The present invention relates to a multiport DRAM (Dynamic Random Access Memory).

FIG. 4 shows a configuration of a dual port DRAM as an example of prior art multiport DRAMs. This multiport DRAM includes a RAM (Random Access Memory) section 5 for implementing random access operation, a data transfer gate section 6 for controlling data transfer from the RAM section, and a SAM (Serial Access Memory) section 7 for implementing serial access operation.

The RAM section 5 is composed of a first RAM 5A in which the MSB (Most Significant Bit) of the column address is "0" and a second RAM 5B in which the MSB of the column address is "1". Furthermore, the data transfer gate section 6 is composed of a first transfer gate 6A and a second transfer gate 6B, so as to correspond to the two RAMs. The SAM section 7 is composed of a first data register 7C, a second register 7D, and an input/output buffer 8.

In the above-mentioned configuration, data are written to or read from the RAM section 5 in the same way as in an ordinary DRAM. In the case of the data write operation, a data inputted from external through an I/O buffer 2 is written to a memory cell of the RAM section 5 whose address corresponds to an address signal inputted through an address buffer 1. In this operation, the address signal is transmitted to a column address decoder 3 and a row address decoder 4 via the address buffer 1 for decoding, and a memory cell whose row and column correspond to the decoded address is selected.

Data are transferred from the RAM section 5 to the SAM section 7 as follows: first, data stored in a row of the RAM section 5A, for instance are transmitted to the data register 7C of the SAM section 7 through the transfer gate 6A. In more detail, as shown in FIG. 5, when one word line (e.g., $WL_i$) is selected, data are read from the memory cells connected to the word lines $WL_i$ of the respective blocks $a_1, a_2, a_3, a_4$ of the RAM 5A to the respective bit line $\overline{BL}_{0j}$ (j=1, 2, ... n); these read data are amplified by sense amplifiers $SA_{01}$, $SA_{02}$, $SA_{03}$, $SA_{04}$; and the read data are outputted to the bit line $\overline{BL}_{0j}$ after amplification. In this operation, when a control signal for turning on the transfer gate 6A is transmitted to a control line CL, the transfer gate 6A is turned on; the amplified data are transferred to the respective blocks $c_1, c_2, c_3, c_4$ of the data register 7C; and then the read data are stored in the respective blocks when the transfer gate 6A is turned off. Each block of the data register 7C is composed of a flip-flop composed of two P-channel transistors and two N-channel transistors, and a DQ (input/output) gate 14. The P-channel transistors of the flip-flop are connected to the $D_1$ line and the N-channel transistors of the flip-flop are connected to the $D_2$ line, respectively. A drive potential $V_{cc}$ is applied to one of these $D_1$ and $D_2$ lines and zero potential is applied to the other of these lines. Furthermore, in FIG. 5, each block of the data register 7C of the SAM section 7 is connected to a pair of bit line $BL_{0j}$ and bit line $\overline{BL}_{0j}$ through the respective transfer gates 6A. However, there exists another type in which one end of each block $c'_j$ is connected to one of a pair of the bit lines (e.g., bit line $BL_{0j}$) via a transfer gate 6A; and the transferred data are inverted through a NOT gate 60 before the transferred data are stored, as shown in FIG. 6.

As described above, after data have been transferred from the RAM 5A to the data register 7C, when the DQ gate 14 of the SAM section 7 is turned on (see FIG. 5), the data transferred to the data register 7C are outputted to the outside via the output/input buffer 8 of the SAM section 7 (see FIG. 4). During this data output operation, the data stored in a row of the RAM 5B are transferred to the data register 7D through the transfer gate 6B in the same way as described already. Furthermore, when the data transmitted to the data register 7D are being outputted to the outside through the input/output buffer 8, the data stored in a row of the RAM 5A are transferred to the data register 7C through the transfer gate 6A. By repeating the above-mentioned operation, necessary data stored in RAM section 5 are outputted to the outside through the SAM section 7 (see FIG. 5). Further, data can be transferred from the SAM section 7 to the RAM section 5 by implementing the above-mentioned procedure in reverse order.

As described above, in the prior art multiport DRAM, as shown in FIG. 5, since the RAM block (e.g., block $a_i$ (i=1, 2, ...)) and the block $c_i$ of data register 7C are arranged so as to correspond to each other one by one, as shown in FIG. 7, the data stored in the RAM 5A are fixedly transferred to the data register 7C and the data stored in the RAM 5B are fixedly transferred to the data register 7D, respectively. Accordingly, when data are required to be read from the SAM section 7 in series fashion, after data stored in one of the data registers 7C and 7D have been read, data stored in the other thereof are further read. In other words, data stored on the RAM 5A side and the RAM 5B side are inevitably read alternately.

As described above, in the prior art multiport DRAM, it is impossible to continuously read data stored on only the RAM 5A side or the RAM 5B side. In the same way, it is impossible to continuously write data to only the RAM 5A side or the RAM 5B side.

SUMMARY OF THE INVENTION

The object of the present invention is to provide a multiport DRAM which can implement continuous data reading and writing operation from and to the same RAM block, in addition to alternate data reading and writing operation between the RAM blocks.

To achieve the above-mentioned object, the present invention provides a multiport DRAM comprising: a RAM section having a plurality of alternately arranged RAM blocks for constructing a first RAM section and a second RAM section, respectively; a SAM section having a plurality of SAM blocks for constructing a first SAM section and a second SAM section, respectively, so as to correspond to the respective RAM blocks; a data transfer control section disposed between said RAM section and said SAM section, for controlling data transfer between said RAM section and said SAM section, and wherein: an inversion side and a non-inversion side of mutually complementary bit lines of said plural RAM blocks are reversed for each block; adjacent bit lines of the RAM block belonging to the first RAM section and the RAM block belonging to the adjacent second RAM section are connected in common to any one of a data line of the SAM block corresponding to the RAM block belonging to the first RAM section and a data line of the SAM block corresponding to the RAM block belonging to the adjacent second RAM section; and said data transfer control section includes four switches for enabling data transfer from either of the first RAM section and the second RAM section to either of the first SAM section and the second SAM section by controlling conduction of the respective bit lines of the RAM block belonging to the first RAM section and the RAM block of the adjacent second RAM section, respectively and independently.

In the multiport DRAM according to the present invention thus constructed, it is possible to realize cross-transfer by controlling the data transfer control gate, in such a way that data can be transferred not only from a plurality of RAM blocks each constituting the first RAM section and the second RAM section to the first SAM section and the second SAM section arranged so as to correspond to the RAM sections, but also from the RAM blocks of the first RAM section to the SAM blocks of the second SAM section adjacent thereto and additionally from the RAM blocks of the second RAM section to the first SAM section adjacent thereto. Therefore, it is possible to implement continuous data reading and writing operation from and to the same RAM block, in addition to the alternate data reading and writing operation between the RAM blocks.

BRIEF DESCRIPTION OF THE DRAWINGS

In the attached drawings:

FIG. 6 is a block diagram showing another example of the SAM blocks of the prior art multiport DRAM; and FIG. 7 is a block diagram for assistance in explaining the problems involved in the prior art multiport DRAM.

DETAILED DESCRIPTION OF THE PREFERRED EMBODIMENTS

Figure 1:
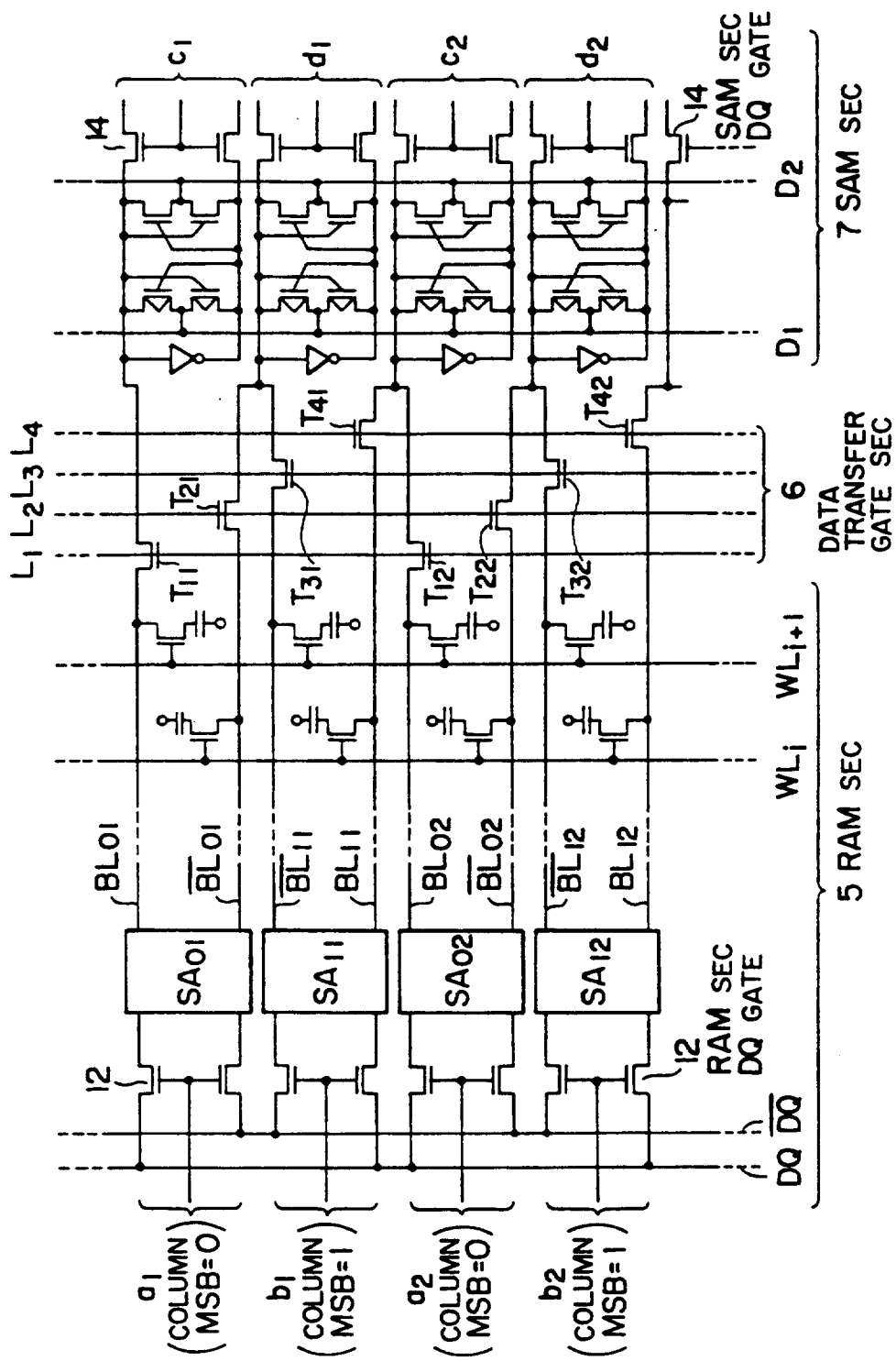
FIG. 1 is a circuit diagram showing the configuration of one embodiment of the multiport DRAM according to the present invention.

FIG. 1 shows the configuration of an embodiment of the multiport DRAM according to the present invention. The multiport DRAM comprises a RAM section 5, a data transfer gate section 6, and a SAM section 7. The RAM section 5 includes 2n-piece RAM blocks $a_i$, $b_i$ ($i=1, 2, \ldots n$), data input/output lines DQ, $\overline{DQ}$, and m-piece word lines $WL_j$ ($j=1, 2, \ldots m$). Further, each RAM block is composed of a DQ gate 12 connected to the data input/output line, a sense amplifier SA connected to the DQ gate, a pair of bit lines BL and bar BL connected to the sense amplifier, and 2mn-piece memory cells connected to a pair of these bit lines, respectively. Furthermore, the RAM blocks $a_i$ ($i=1, 2, \ldots n$) in each of which the MSB (Most Significant Bit) of the column address is "0" and the RAM blocks $b_i$ ($i=1, 2, \ldots n$) in each of which the MSB of the column address is "1" are arranged alternately in such a way that data directions of BL or bar BL of each pair of bit lines BL and bar BL of the two adjacent RAM blocks match each other. In more detail, for instance, the RAM block $a_{i+1}$ ($i=1, 2, \ldots n-1$) is arranged between the RAM block $b_i$ and RAM block $b_{i+1}$, and additionally the bit line $BL_{0i+1}$ of a pair of bit lines $BL_{0i+1}$ and $\overline{BL}_{0i+1}$ of the RAM block $a_{i+1}$ is adjacent to the bit line $BL_{1i}$ of the RAM block $b_i$ and the bit line $\overline{BL}_{0i+1}$ is adjacent to the bit line $\overline{BL}_{1i+1}$ of the RAM block $b_{i+1}$.

On the other hand, the data transfer gate Section 6 includes 4n-piece gate transistors $T_{11}, \ldots T_{1n}, T_{21}, \ldots T_{2n}, T_{31}, \ldots T_{3n}, T_{41}, \ldots T_{4n}$, and 4 control lines $L_1, L_2, L_3, L_4$. Further, the SAM Section 7 includes $(2n+1)$-piece SAM blocks $c_1, d_1, c_2; \ldots ; c_n, d_n, c_{n+1}$, and 4n-piece DQs 14 gates 14 disposed two by two for each SAM block. The SAM blocks are arranged in the order of $c_1, d_1, c_2, \ldots, c_n, d_n, c_{n+1}$. Furthermore, each SAM block includes an input terminal, two output terminals, a NOT gate, two P-channel transistors, and two N-channel transistors. Data inputted through the input terminal are inverted by the NOT gate, stored in the flip-flop composed of the two P-channel transistors and two N-channel transistors, and transmitted to the outside through the two output terminals by opening or closing the DQ gate. Furthermore, data transmitted from the outside through the two output terminals are stored in the flip-flop.

Either one of the source or the drain of the gate transistor $T_{1i}$ ($i=1, 2, \ldots n$) is connected to the bit line $BL_{0i}$ of the RAM block $a_i$; the other thereof is connected to the input terminal of the SAM block $c_i$; and the gate thereof is connected to the control line $L_1$. Further, either one of the source or drain of the gate transistor $T_{2i}$ ($i=1, 2, \ldots n$) is connected to the bit line bar $\overline{BL}_{0i}$ of the RAM block $a_i$; the other thereof is connected to the input terminal of the SAM block $d_i$; and the gate thereof is connected to the control line $L_2$. Furthermore, either one of the gate transistor $T_{3i}$ ($i=1, 2, \ldots n$) is connected to the bit line bar $\overline{BL}_{1i}$ of the RAM block $b_i$; the other thereof is connected to the input terminal of the SAM block $d_i$; and the gate thereof is connected to the control line $L_3$. Further, either one of the source or the drain of the gate transistor $T_{4i}$ ($i=1, 2, \ldots n$) is connected to the bit line $BL_{1i}$ of the RAM block $b_i$; the other thereof is connected to the input terminal of the SAM block $c_{i+1}$; and the gate thereof is connected to the control line $L_4$.

Therefore, it is possible to transfer data from the RAM block $a_i$ to the SAM block $c_i$ or from the RAM block $c_i$ to the RAM block $a_i$ by controlling the gate transistor $T_{1i}$ ($i=1, 2, \ldots n$) via the control line $L_1$. Furthermore, it is possible to transfer data between the RAM block $a_i$ and SAM block $d_i$ by controlling the gate transistor $T_{2i}$ ($i=1, 2, \ldots n$) via the control line $L_2$. Furthermore, it is possible to transfer data between the RAM block $b_i$ and the SAM block $d_i$ by controlling the gate transistor $T_{3i}$ ($i=1, 2, \ldots n$) via the control line $L_3$. Furthermore, it is possible to transfer data between the RAM block $b_i$ and the SAM block $c_{i+1}$ by controlling the gate transistor $T_{4i}$ ($i=1, 2, \ldots n$) via the control line $L_4$.

Figure 2:
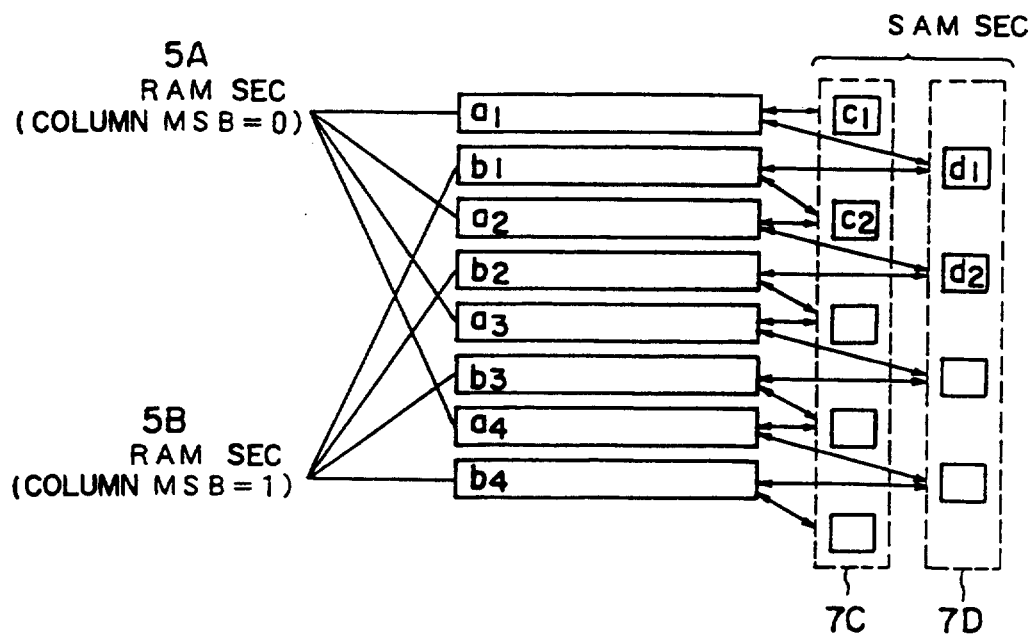
FIG. 2 is a block diagram for assistance in explaining the data transfer effect of the embodiment.
Figure 3:
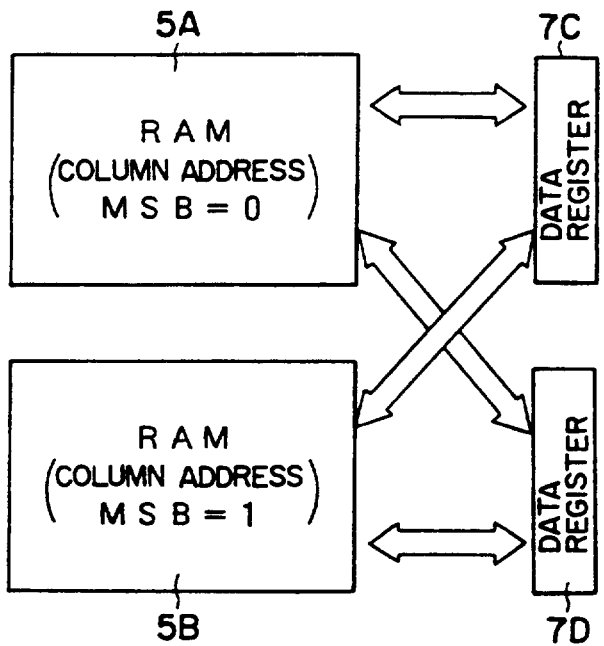
FIG. 3 is a block diagram for assistance in explaining the data transfer effect of the embodiment.
Figure 4:
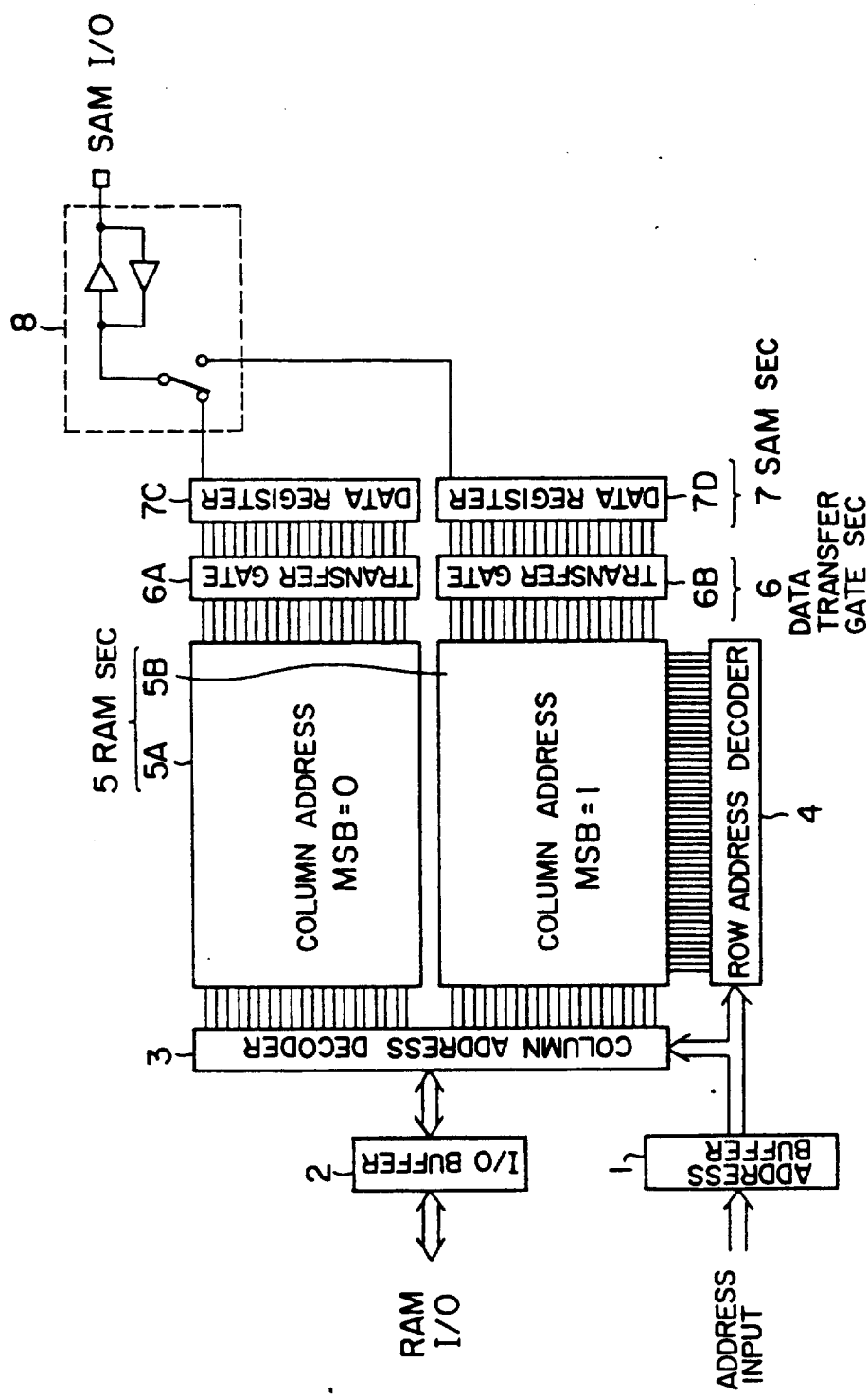
FIG. 4 is a block diagram showing the configuration of a prior art multiport DRAM.
Figure 5:
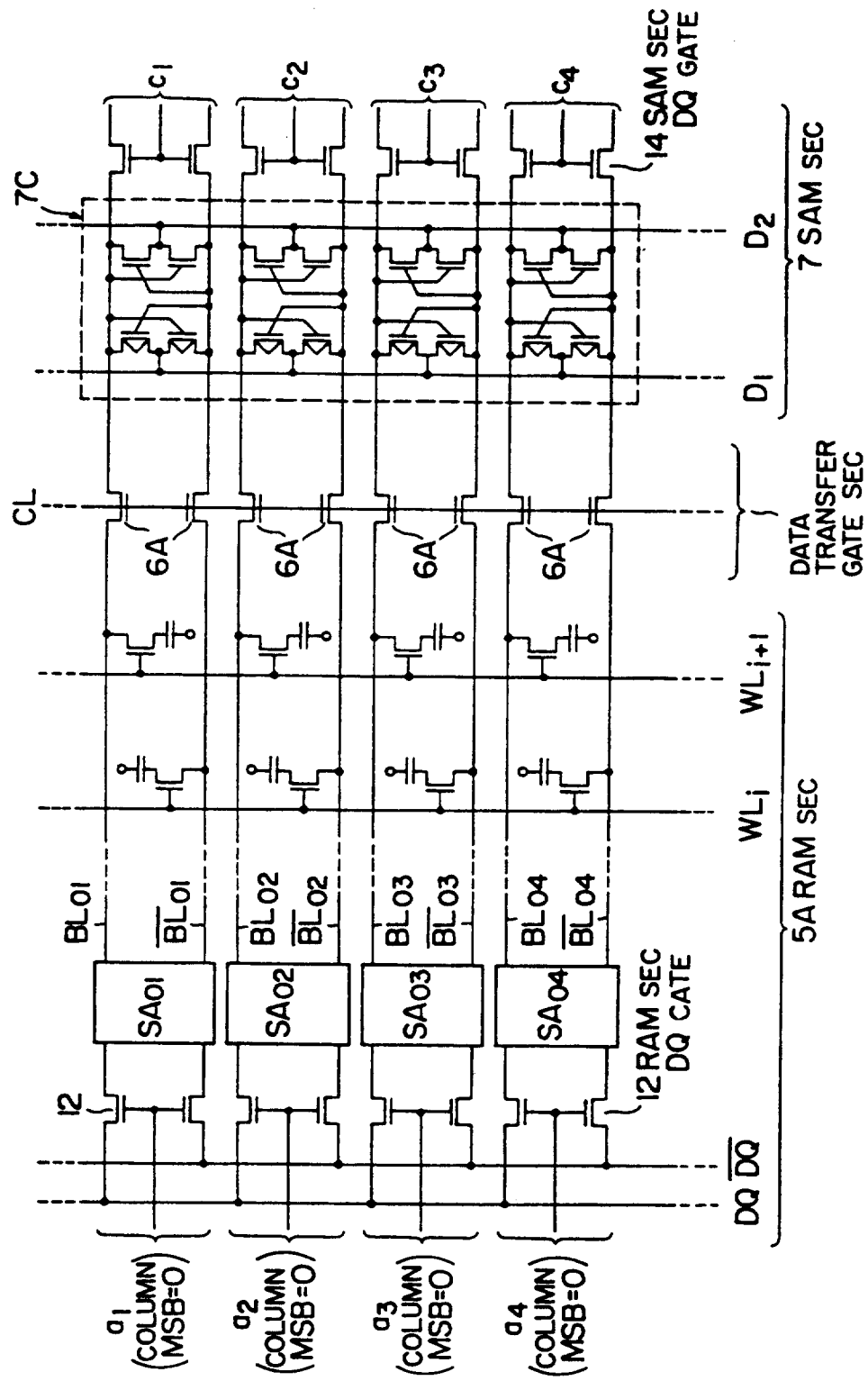
FIG. 5 is a circuit diagram showing the same prior art multiport DRAM.

That is, as shown in FIGS. 2 and 3, data can be transmitted not only between the RAM section 5A composed of the RAM blocks $a_1, \ldots a_n$ in each of which the MSB of the column address is "0" and the data register 7C composed of the SAM blocks $c_1, \ldots c_{n+1}$, but also between the RAM 5A and the data register 7D composed of the SAM blocks $d_1, \ldots d_n$. Further, data can be transmitted between the RAM 5B composed of the RAM blocks $b_1, \ldots b_n$ in each of which the MSB of the column address is "1" and the data register 7C, and between the RAM 5B and the data register 7D. Further, when data are transferred from the RAM 5B to the data register 7C and further, the transferred data are read from the data register 7C, the count value of the address counter is incremented.

As described above, after data have been transferred from the RAM (e.g., RAM 5A) to either one of the data register 7C or the data register 7D, it is possible to transfer data from the RAM 5A to the other of the data registers. Further, after data have been transferred from either one of the data register 7C or the data register 7D to the RAM (e.g., RAM 5A), it is possible to transfer data from the other of the data registers to the RAM 5A, thus enabling continuous data reading and writing operation from and to the same RAM blocks. Further, it is of course possible to implement the alternate data reading and writing operation between the RAM blocks, as is possible conventionally.

What is claimed is:

1. A multiport DRAM comprising:
   a RAM section having a plurality of alternately arranged RAM blocks for constructing a first RAM section and a second RAM section, respectively;
   a SAM section having a plurality of SAM blocks for constructing a first SAM section and a second SAM section, respectively, so as to correspond to the respective RAM blocks; and
   a data transfer control section disposed between said RAM section and said SAM section, for controlling data transfer between said RAM section and said SAM section,
   an inversion side and a non-inversion side of mutually complementary bit lines of said plural RAM block being reversed for each block; adjacent bit lines of the RAM blocks belonging to the first RAM section and the RAM block belonging to the adjacent second RAM section being connected in common to any one of a data line of the SAM block corresponding to the RAM block belonging to the first RAM section and a data line of the SAM block corresponding to the RAM block belonging to the adjacent second RAM section; and said data transfer control section including four switches for enabling data transfer from either of the first RAM section and the second RAM section to either of the first SAM section and the second SAM section by controlling conduction of the respective bit lines of the RAM block belonging to the first RAM section and the RAM block of the adjacent second RAM section, respectively and independently.

2. The multiport DRAM of claim 1, wherein the adjacent bit lines of the adjacent RAM blocks are connected to logically same input/output lines through sense amplifiers and input/output gates of the blocks, respectively.

3. The multiport DRAM of claim 1, wherein mutually complementary data lines of said SAM section include a first line connected to the common junction point and a second line inverted relative to the first line via an inverter.

4. The multiport DRAM of claim 1, wherein the number of the SAM blocks is larger by one than that of the RAM blocks.

5. A multiport DRAM comprising:
   a RAM section composed of n-piece RAM blocks ($a_i$) ($i = 1, 2, \ldots n$) including a plurality of memory cells having a "0" most significant bit in column address and connected to a pair of bit lines ($BL_{0i}$) and bar ($\overline{BL_{0i}}$), respectively, and n-piece RAM blocks ($b_i$)-($i = 1, 2, \ldots n$) including a plurality of memory cells having a "1" most significant bit in column address and connected to a pair of bit lines ($BL_{1i}$) and bar ($\overline{BL_{1i}}$), respectively;
   a SAM section composed of a first data register including first and second terminals and (n+1)-piece SAM blocks ($c_i$)($i = 1, \ldots n+1$) for inverting data inputted through the first terminal, storing the inverted data, and storing data inputted through the second terminal, and a second data register including third and fourth terminals and n-piece SAM blocks ($d_i$)($i = 1, \ldots n$) for inverting data inputted through the third terminal, storing the inverted data, and storing data inputted through the fourth terminal;
   a data transfer gate section including 4n-piece gate transistors ($T_{ji}$)($j = 1, \ldots 4, i = 1, \ldots n$) and first, second, third, and fourth control lines;
   the n-piece RAM blocks $a_i$ ($i = 1, \ldots n$) and the n-piece RAM blocks ($b_i$)($i = 1, \ldots n$) being juxtaposed alternately, and two adjacent bit lines of two pairs of bit lines of the two adjacent RAM blocks being arranged so that the data direction matches each other;
   the (n+1)-piece SAM blocks ($c_i$)($i = 1, \ldots n+1$) of the first data register and n-piece SAM blocks ($d_i$)-($i = 1, \ldots n$) of the second data register being disposed alternately;
   gates of the gate transistors ($T_{1i}$)($i = 1, \ldots n$) being connected to the first control line, either of sources and drains thereof being connected to either of the bit lines ($BL_{0i}$) of the RAM blocks $a_i$ and the first terminals of the SAM blocks ($c_i$), respectively;
   gates of the gate transistors ($T_{2i}$) ($i = 1, \ldots n$) being connected to the second control line, either of sources and drains thereof being connected to either of the bit lines bar ($\overline{BL_{0i}}$) and the third terminals of the SAM blocks ($d_i$), respectively;
   gates of the gate transistors ($T_{3i}$)($i = 1, \ldots n$) being connected to the third control line, either of sources and drains thereof being connected to either of the bit lines bar ($\overline{BL_{1i}}$) of the RAM blocks ($b_i$) and the third terminals of the SAM blocks ($d_i$) respectively; and
   gates of the gate transistors ($T_{4i}$)($i = 1, \ldots n$) being connected to the fourth control line, either of sources and drain thereof being connected to either of the bit lines ($BL_{1i}$) of the RAM blocks ($b_i$) and the first terminals of the SAM blocks ($c_{i+1}$), respectively.

* * * * *